(12) United States Patent
von Koblinski et al.

(10) Patent No.: US 9,117,801 B2
(45) Date of Patent: Aug. 25, 2015

(54) SEMICONDUCTOR DEVICES HAVING A GLASS SUBSTRATE, AND METHOD FOR MANUFACTURING THEREOF

(71) Applicant: Infineon Technologies AG, Neubiberg (DE)

(72) Inventors: Carsten von Koblinski, Bodensdorf (AT); Ulrike Fastner, Villach (AT); Peter Zorn, Villach (AT); Markus Ottowitz, Arnoldstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/894,682

(22) Filed: May 15, 2013

(65) Prior Publication Data

US 2014/0339694 A1 Nov. 20, 2014

(51) Int. Cl.
| | |
|---|---|
| *H01L 21/48* | (2006.01) |
| *H01L 23/498* | (2006.01) |
| *H01L 21/78* | (2006.01) |
| *H01L 23/31* | (2006.01) |
| *H01L 23/00* | (2006.01) |

(52) U.S. Cl.
CPC .......... *H01L 21/481* (2013.01); *H01L 21/4846* (2013.01); *H01L 21/78* (2013.01); *H01L 23/3171* (2013.01); *H01L 23/498* (2013.01); *H01L 24/00* (2013.01); *H01L 2924/12032* (2013.01); *H01L 2924/13055* (2013.01)

(58) Field of Classification Search
CPC ................. H01L 23/5389; H01L 2221/68345; H01L 2221/68359; H01L 31/0512; H01L 21/4853; H01L 21/561; H01L 21/563; H01L 2224/05082; H01L 23/485; H01L 2924/15788; H01L 2924/16788; H01L 31/0203

USPC ................... 257/E23.009, E21.499, E21.599, 257/E23.192, 680, 704, 729, 784, E23.023, 257/782

See application file for complete search history.

(56) References Cited

U.S. PATENT DOCUMENTS

| | | | |
|---|---|---|---|
| 6,326,697 B1 * | 12/2001 | Farnworth | .................... 257/779 |
| 7,298,030 B2 | 11/2007 | McWilliams et al. | |
| 7,691,726 B2 * | 4/2010 | Seng | .............................. 438/462 |
| 7,754,531 B2 * | 7/2010 | Tay et al. | ....................... 438/112 |

(Continued)

FOREIGN PATENT DOCUMENTS

| | | |
|---|---|---|
| DE | 102011051822 A1 | 1/2012 |
| DE | 102011051823 A1 | 4/2012 |
| DE | 102011055500 A1 | 5/2012 |

*Primary Examiner* — Brett A. Feeney
*Assistant Examiner* — Paul Patton
(74) *Attorney, Agent, or Firm* — Murphy, Bilak & Homiller, PLLC

(57) ABSTRACT

A method for manufacturing semiconductor devices includes providing a stack having a semiconductor wafer and a glass substrate with openings and at least one trench attached to the semiconductor wafer. The semiconductor wafer includes a plurality of semiconductor devices. The openings of the glass substrate leave respective areas of the semiconductor devices uncovered by the glass substrate and the trench connects the openings. A metal layer is formed at least on exposed walls of the trench and the openings and on the uncovered areas of the semiconductor devices of the semiconductor wafer. A metal region is formed by electroplating metal in the openings and the trench and by subsequently grinding the glass substrate to remove the trenches. The stack of the semiconductor wafer and the attached glass substrate is cut to separate the semiconductor devices.

23 Claims, 11 Drawing Sheets

(56) References Cited

U.S. PATENT DOCUMENTS

| | | |
|---|---|---|
| 8,202,786 B2 | 6/2012 | Von Koblinski et al. |
| 2012/0012994 A1 | 1/2012 | Von Koblinski et al. |
| 2012/0013029 A1 | 1/2012 | Zelsacher et al. |
| 2012/0126926 A1 | 5/2012 | Kroener et al. |
| 2012/0248631 A1 | 10/2012 | Von Koblinski et al. |

* cited by examiner

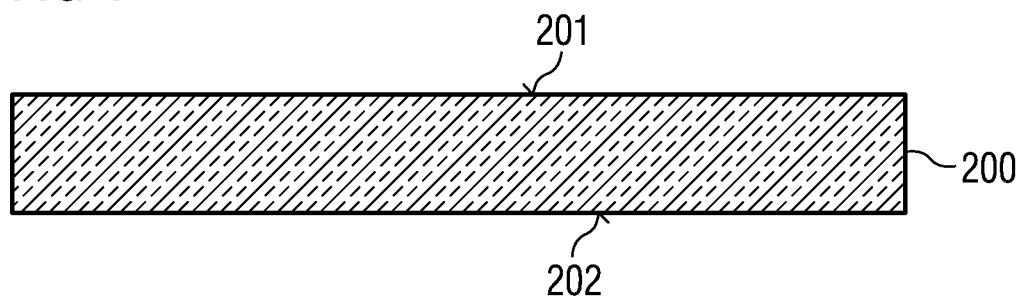
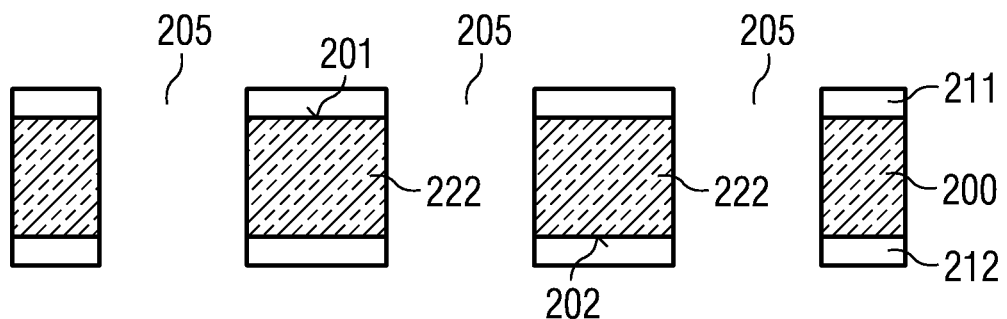

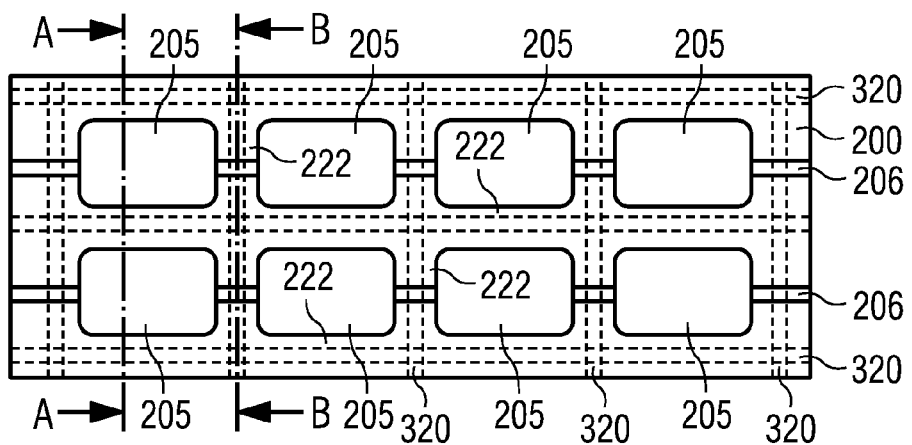
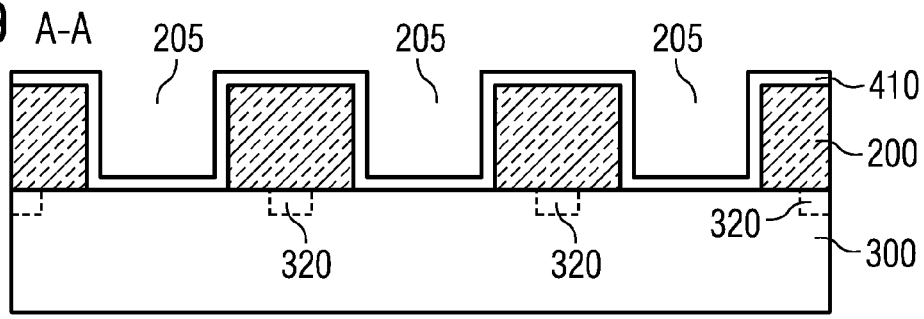
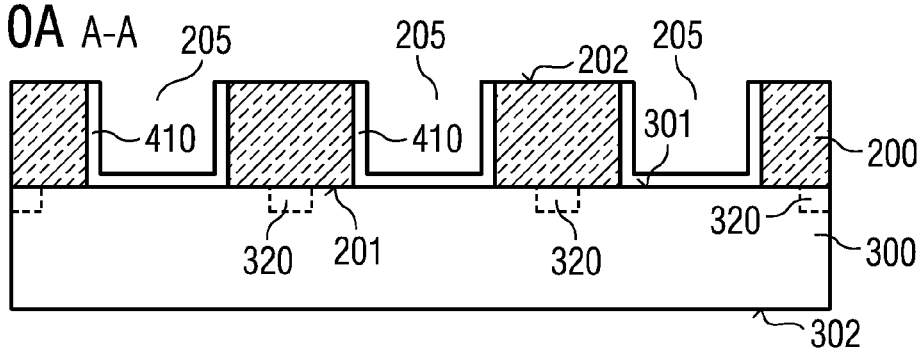
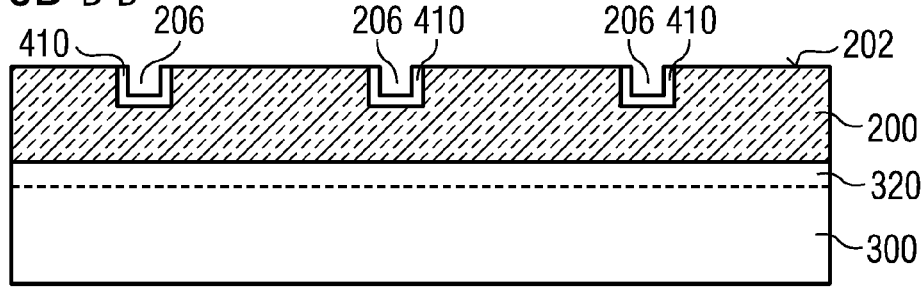

SEMICONDUCTOR DEVICES HAVING A GLASS SUBSTRATE, AND METHOD FOR MANUFACTURING THEREOF

TECHNICAL FIELD

Embodiments described herein relate to semiconductor devices and methods for manufacturing semiconductor devices.

BACKGROUND

Metal layers are formed on semiconductor materials to provide a good ohmic contact to the semiconductor material and to dissipate heat generated in the semiconductor material during operation of semiconductor devices integrated in the semiconductor material. Depending on the operation of the semiconductor devices, heat pulses may occur which need to be effectively dissipated.

Manufacturing of thick metallization layers can pose problems as the deposition techniques commonly used only allow deposition at low rate which causes long manufacturing times. Furthermore, the deposited metallization layers needs to be patterned which include additional manufacturing processes.

In view of the above, there is a need for improvement.

SUMMARY

According to an embodiment, a method for manufacturing semiconductor devices includes providing a stack including a semiconductor wafer and a glass substrate attached to the semiconductor wafer, wherein the semiconductor wafer includes a plurality of semiconductor devices, and wherein the glass substrate includes a plurality of openings each leaving a respective area of the semiconductor devices uncovered by the glass substrate and at least one trench formed on a side of the glass substrate facing away from the semiconductor wafer and connecting the openings, wherein the trench has a depth less than a thickness of the glass substrate. The method further includes forming a metal layer at least on exposed walls of the trench and the openings and on the uncovered areas of the semiconductor devices of the semiconductor wafer; forming a metal region by electroplating metal in the openings and the trench and by subsequently grinding the glass substrate to remove the trenches; and cutting the stack including the semiconductor wafer and the attached glass substrate to separate the semiconductor devices.

According to an embodiment, a method for manufacturing semiconductor devices includes: providing a glass substrate having a first side, a second side and a plurality of openings, wherein the glass substrate has an initial thickness; forming trenches in the glass substrate at the second side of the glass substrate, wherein the trenches connect the openings and have a depth which is less than the initial thickness of the glass substrate; attaching the glass substrate at its first side to a first side of a semiconductor wafer having a plurality of semiconductor devices so that the openings of the glass substrate leave respective areas of the semiconductor devices uncovered at the first side of the semiconductor wafer; forming a metal layer at least on exposed walls of the trenches and the openings and on the uncovered areas of the semiconductor devices of the semiconductor wafer; forming a metal region by electroplating metal in the openings and the trenches and by subsequently grinding the glass substrate to remove the trenches; and cutting the stack including the semiconductor wafer and the attached glass substrate to separate the semiconductor devices.

According to an embodiment, a method for manufacturing a semiconductor module includes: providing a semiconductor device including a semiconductor substrate and a glass substrate attached to the semiconductor substrate, wherein the glass substrate has at least one opening leaving a respective area of the semiconductor device uncovered by the glass substrate; forming at least one solder bump in the opening of the glass substrate on the uncovered area of the semiconductor device; and soldering the semiconductor device with the solder bump on a lead frame with the glass substrate arranged between the lead frame and the semiconductor substrate.

According to an embodiment, a method for manufacturing semiconductor modules includes: providing a stack comprising a semiconductor wafer and a glass substrate attached to the semiconductor wafer, the semiconductor wafer comprising a plurality of semiconductor devices, the glass substrate comprising a plurality of openings each leaving a respective area of the semiconductor devices uncovered by the glass substrate; forming solder bumps in the openings of the glass substrate on the uncovered areas of the semiconductor device; and cutting the stack to form separate semiconductor devices.

According to an embodiment, a semiconductor device includes a semiconductor substrate and a glass substrate attached to the semiconductor substrate, wherein the glass substrate has at least one opening leaving a respective area of the semiconductor device uncovered by the glass substrate. A metal layer is formed on walls of the opening in the glass substrate and on the uncovered areas of the semiconductor device, and a metal region is formed on the metal layer filling the opening, wherein an upper surface of the metal region is flush with an upper surface of the glass substrate.

According to an embodiment, a semiconductor device includes a semiconductor substrate and a glass substrate attached to the semiconductor substrate, wherein the glass substrate includes at least one opening leaving a respective area of the semiconductor device uncovered by the glass substrate. At least one solder bump is arranged in the opening of the glass substrate on the uncovered area of the semiconductor device.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1 illustrates a process of a method for manufacturing a semiconductor device according to an embodiment;

FIG. 2 illustrates a process of a method for manufacturing a semiconductor device according to an embodiment;

FIG. 8 illustrates a process of a method for manufacturing a semiconductor device according to an embodiment;

FIG. 9 illustrates a process of a method for manufacturing a semiconductor device according to an embodiment;

FIGS. 10A and 10B illustrate processes of a method for manufacturing a semiconductor device according to an embodiment;

DETAILED DESCRIPTION

Figure 3A:
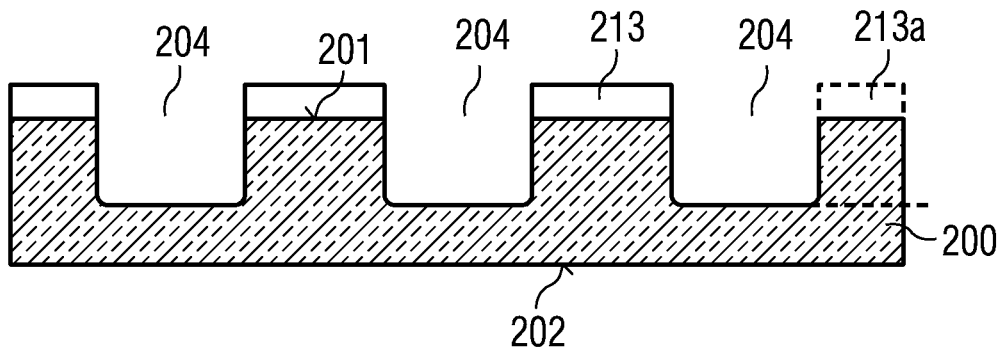
FIGS. 3A to 3C illustrate processes of a method for manufacturing a semiconductor device according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

An embodiment is described next with reference to FIGS. 1 to 13. This embodiment includes formation of a thick metal region on a front side of a semiconductor wafer by electroplating using a structured glass substrate permanently bonded to a semiconductor wafer as a mask.

With reference to FIG. 1, a glass substrate 200 is provided having a first side 201 and a second side 202 opposite the first side 201. Openings 205 are subsequently formed in the glass substrate 200.

According to an embodiment, the openings 205 can be formed by using a first mask 211 formed on the first side 201 of the glass substrate 200 and a second mask 212 formed on the second side 202 of the glass substrate 200 as illustrated in FIG. 2. The first and second masks 211, 212 include openings which define the size and location of the openings 205 to be formed in the glass substrate 200. The first and second masks 211, 212 are aligned with each other so that corresponding openings in the first and second masks 211, 212 overlap and cover each other. The glass substrate 200 is then etched using the first and the second masks 211, 212 as etching masks.

Figure 3B:
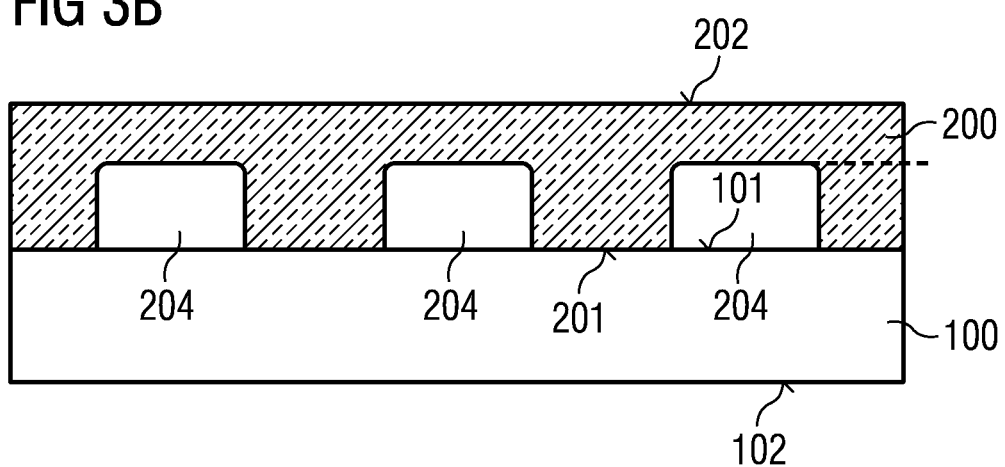
Figure 3C:
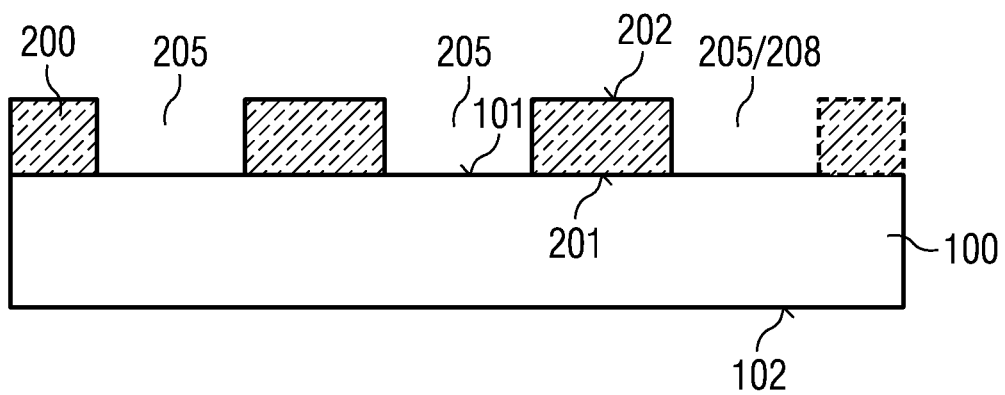

An alternative approach to forming the openings 205 is illustrated in FIGS. 3A to 3C. A mask 213 is formed only on one side of the glass substrate 200, for example on the first side 201 as illustrated in FIG. 3A. The mask 213 defines the size and location of the openings 205 to be formed in the glass substrate 200. In a subsequent process, the glass substrate 200 is etched using the mask 213 as etching mask to form recesses 204 as illustrated in FIG. 3A. The depth of the recesses 204 can be about 50% or more of the thickness of the glass substrate 200.

In a further process, the glass substrate 200 with the recesses 204 formed therein is reversibly or releasably (temporarily) attached to a carrier substrate 100 with the first side 201 having the recesses 204 facing the carrier substrate 100. The recesses 204 are thus covered and closed by the carrier substrate 100 as illustrated in FIG. 3B to form cavities.

In a further process, the second side 202 of the glass substrate 200 opposite the recesses 204 is processed, for example mechanically polished or ground, until the recesses 204 are exposed as illustrated in FIG. 3C. As a result, the glass substrate 200 carried by the carrier substrate 100 is provided with openings 205 which are formed by the exposed recesses 204.

The carrier substrate 100 can be any suitable carrier wafer, for example a semiconductor wafer or a glass wafer. The carrier substrate 100 can have the same size as the glass substrate 200, or can be larger or smaller than the glass substrate 200. The glass substrate 200 is typically attached to a first side 101 of the carrier substrate 100. A second side 102 of the carrier substrate 100 is arranged opposite the first side 101.

For reversible or releasable attachment of the glass substrate 200 to the carrier substrate 100, different bonding processes can be used. For example, the glass-carrier substrate 100 is provided with an UV-radiation curable resist layer such as an acrylic layer. The side of the glass substrate 200 facing the carrier substrate 100 is provided with a release layer such as a light-to-heat conversion layer. The glass substrate 200 is placed with the release layer on the resist layer, and the resist layer is cured by UV radiation. This provides a temporary bond between the glass substrate 200 and the carrier substrate 100. For de-bonding the glass substrate 200 from the carrier wafer 100, the release layer can be heated by a laser causing the release layer to release the glass substrate 200. The curable resist layer together with the release layer is commercially available, for example, from 3M™. Alternatively, double-sided adhesive tapes, which are also commercially available, for example by NITTO™ Revalpha™, can be used for temporarily bonding the glass substrate 200 onto the carrier substrate 100.

The recesses 204 as well as the openings 205 can be formed by any suitable etching process. For example, the masks 211, 212, 213 in FIGS. 2 and 3A can be made of amorphous silicon which forms a hard mask. Such a mask can be structured by plasma etching using a photoresist as mask for structuring the silicon mask.

The glass substrate 200 is etched, for example, wet-chemically using HF. To remove the mask 211, 212, 213 from the glass substrate, an alkaline solution can be used.

The embodiment shown in FIGS. 3A to 3C uses the carrier substrate 100 as a carrier during polishing of the glass substrate 200 to reduce its thickness so that the recesses 204 are exposed at their bottoms. The glass substrate 200 as shown in FIG. 2 can also be temporarily bonded onto a carrier substrate 100 after removal of the first and masks 211, 212 by any of the above described techniques. Alternatively, the carrier substrate 100 can be omitted when the glass substrate 200 is sufficiently mechanically stable for handling.

In addition to the openings 205, a ring structure or a step 208 can be formed in the glass substrate 200 as indicated in FIGS. 3A to 3C. For example, a region 213a of the mask 213 can be removed or not formed so that a larger recess is formed which can extend up to a lateral rim of the glass substrate 200. This is indicated by the dashed lines in FIGS. 3A and 3B. In this case, the dashed region in FIG. 3C of the glass substrate 200 is not formed.

The regions between adjacent ones of the openings 205 are referred to as bars 222 which delimit the openings 205 from each other. These bars 222, as illustrated in FIG. 2, will later cover separation lines of a semiconductor wafer.

Figure 4A:
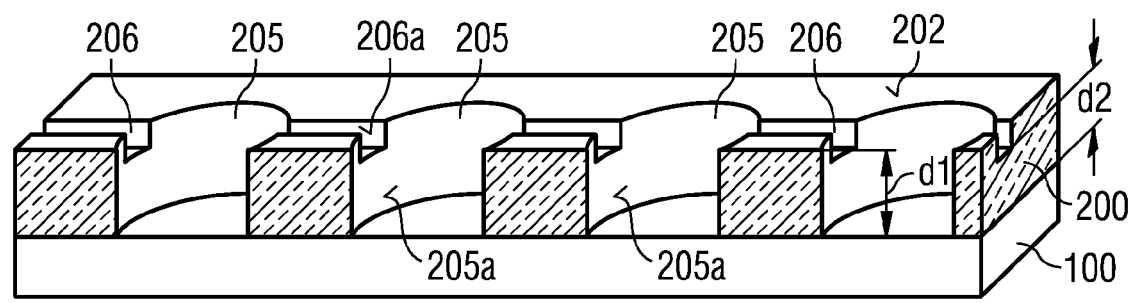
FIGS. 4A and 4B illustrate processes of a method for manufacturing a semiconductor device according to an embodiment.
Figure 4B:
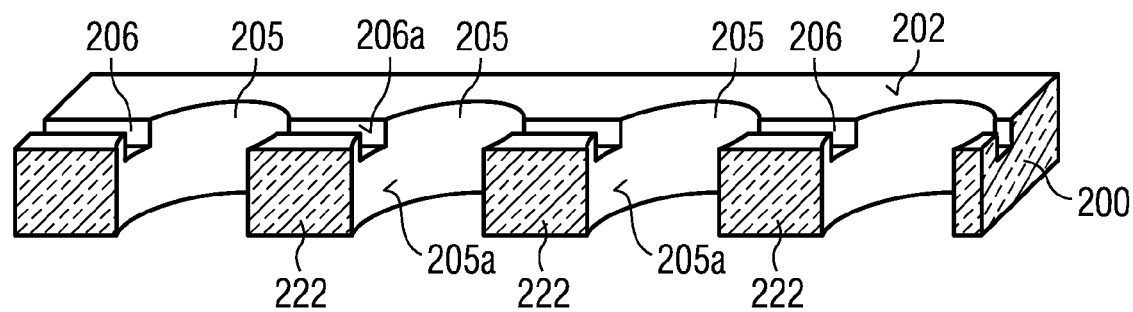

In a further process, as illustrate in FIG. 4A, a trench 206 is formed in the glass substrate 200 at the exposed second side 202 while the glass substrate 200 is supported and carried by the carrier wafer 100. The trench 206 can be formed, for example, by cutting using a saw. The width of the trench 206 can be between about 50 and 150 μm without being limited thereto. The function of the trenches 206 is to provide a connection between the openings 205 which allow formation of an electrical connection for connecting the openings 205 during electroplating.

Figure 6:
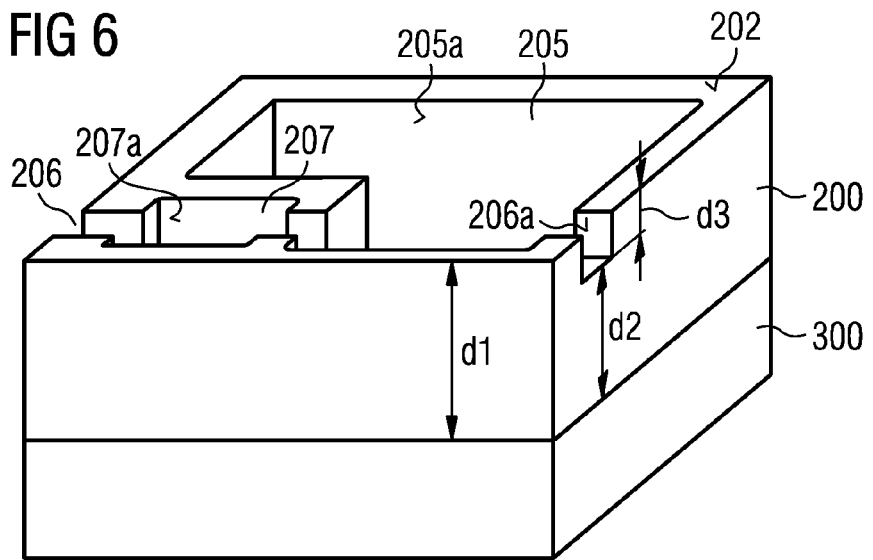
FIG. 6 illustrates a process of a method for manufacturing a semiconductor device according to an embodiment.

The trenches 206 can have a depth d3 which is less than the thickness d1 of the glass substrate 200. The thickness d1 of the glass substrate 200 is also referred to as initial thickness. The depth d3 is typically less than 50% of the thickness d1. Typically, the remaining thickness d2, which is the difference of d1 and d3 as illustrated in FIG. 6 is equal to or larger than 50% of the initial thickness and equal to or larger than the final thickness of the metal region to be formed.

Alternatively, the trenches 206 can be formed in the glass substrate 200 without being supported by the carrier substrate 100, for example, if the glass substrate 200 is mechanically stable enough to withstand the mechanical stress occurring during sawing or cutting. Alternative processes to form the trenches 206 are also possible, for example etching. Sawing is, however, a comparably simple and cost efficient process.

Together with the trenches 206, a ring structure 208, as shown in FIG. 12, can be formed. This ring structure 208 surrounds all openings 205 and serves as a region for contacting and forming a ring conductor to distribute the current during electroplating. This ring structure 208, however, can also be formed by etching together with the openings 205 as described above.

In a further embodiment, the trenches 206 can be formed in the first side 201 of the glass substrate 200 in the stage when there are still recesses 204. The first side 201 is then provided with the trenches 206 and the second side 202, after ground or polished to expose the recesses 204 and to form the openings 205, forms then a side which is brought into contact with a semiconductor wafer 300 as described below.

Figure 5A:
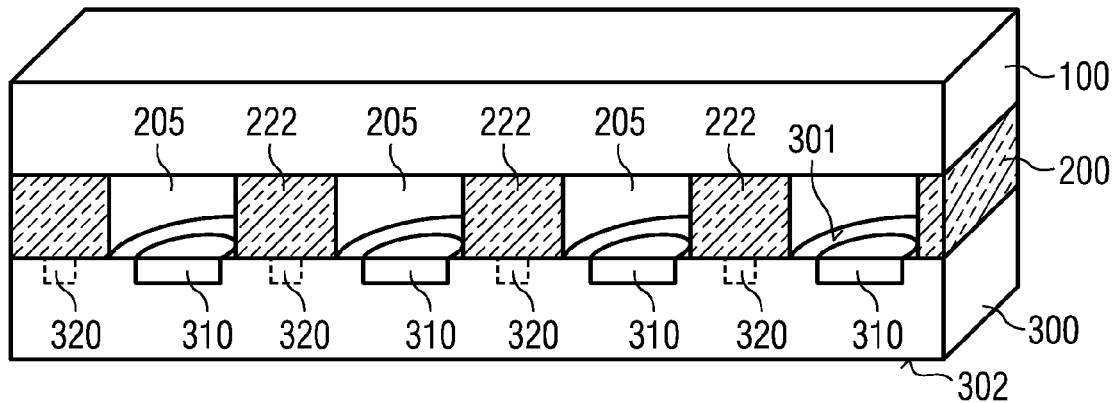
FIGS. 5A and 5B illustrate processes of a method for manufacturing a semiconductor device according to an embodiment.
Figure 5B:
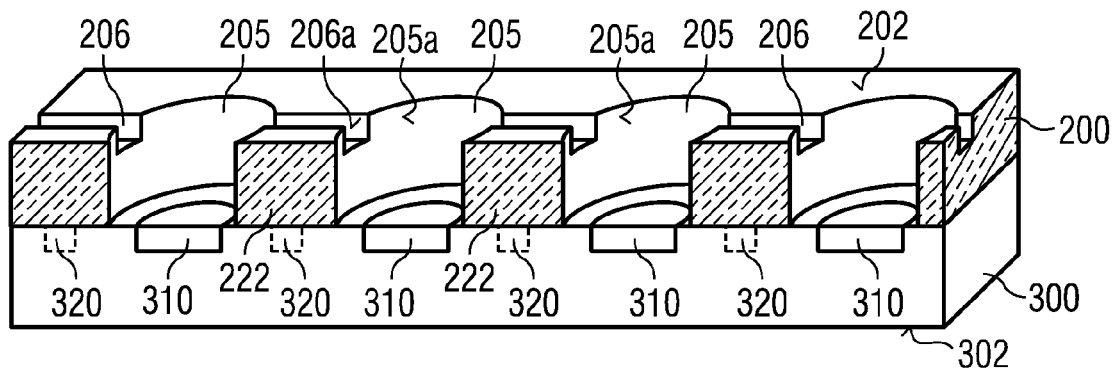

According to a further embodiment, the glass substrate 200 can be permanently bonded to a semiconductor wafer 300 as illustrated in FIG. 5A, followed by removal of the carrier substrate 100 and formation of the trenches 206 in the then exposed second side 202 of the glass substrate 200 as illustrated in FIG. 5B.

The semiconductor wafer 300 includes a plurality of semiconductor devices 310. Between adjacent ones of the semiconductor devices 310, separation lines (dicing kerfs) of a separation or sawing frame 320 are illustrated. Along these separation lines 320, the semiconductor wafer 300 is later cut to separate the semiconductor devices 310 from one another.

The semiconductor wafer 300 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

The semiconductor devices 310 can be, for example, power semiconductor devices such as two-terminal devices and three-terminal devices. Examples of two-terminal devices are pn-diodes and Schottky-diodes, while examples of three-terminal devices are FETs and IGBT. These devices are typically vertical devices having at least one electrode on a first side 301 of the semiconductor wafer 300 and at least another electrode on a second side 302 of the semiconductor wafer 300. The first side 301 can be, for example, the frontside of the semiconductor device, where, for example, the source region of a FET is arranged. The metal regions to be formed function in this case as source metallizations.

When placing the glass substrate 200 onto the semiconductor wafer 300, the bars 222 between adjacent ones of the openings 205 are arranged above and along the separation lines 320 of the sawing frame 320 as illustrated, for example, in FIG. 5B. This becomes more apparent when referring to FIG. 8 which illustrates a top view of the glass substrate 200 bonded to the semiconductor wafer 300. FIG. 8 also illustrates that the bars 222 forming a net-like structure and the openings 205 are 2-dimensionally regularly arranged.

The size of the openings 205 can correspond to the size of doping region forming contact regions of the semiconductor device 310. For example, the source region is typically formed by a heavily n-doped region at the frontside of the semiconductor device. The source region can extend to the lateral edge of the final semiconductor region, i.e. can extend up to the separation lines 320, but is typically spaced therefrom leaving space for edge termination regions.

Furthermore, a source electrode structure can be formed at the first side 301 of the semiconductor wafer 300 with the source electrode structure being laterally spaced from the separation lines 320 to provide sufficient space for edge termination regions. The source electrode structure can be, for example, formed by highly-doped polysilicon.

The size of the openings 205 is selected such that the bars 222 are sufficiently wide to ensure that the final separation of the semiconductor devices 310 can be made along the separations lines 320 and the bars 222, leaving enough glass material at the lateral rim of the separated semiconductor devices 310 to protect the respective semiconductor devices 310 and to form a lateral electrical insulation.

For example, the width of the bars 222 can be at least twice, typically at least three times, for example about 200 μm, of the width of the separation lines 320, which can be e.g. about 70 μm, whereas the width of the separation lines 320 is typically given by the cutting method, for example by the width of the sawing blade or more narrow for laser dicing techniques, or due to stabilisation reasons of the glass grid—silicon wafer compound.

The openings 205, according to an embodiment, leave the active regions of the semiconductor devices 310 or at least most of the active regions uncovered such as to expose the source region or source electrode structure. The active region can be, for example, the regions where the active cells of a power semiconductor device are formed. The peripheral region surrounding the active region and accommodating the edge termination can be covered by the bars 222 of the glass substrate 200.

When trenches 205 are formed in the glass substrate 200 with the glass substrate 200 being supported by the carrier wafer 100, the glass substrate 200 is de-bonded before being bonded to the semiconductor wafer 300. When the glass substrate 200 is not supported by the carrier substrate 100, the glass substrate 200 can be directly bonded to the semiconductor wafer 300.

Hence, the method can include, according to an embodiment, the processes of FIGS. 1, 2, 4A, 4B, and 5B. According to another embodiment, the method can include the processes of FIGS. 1, 2, 4B, and 5B. According to yet another embodiment, the method can include the processes of FIGS. 1, 3A, 3B, 3C, 4A, 4B, and 5B. According to a further embodiment, the method can include the processes of FIGS. 1, 3A, 3B, 3C, 5A and 5B. According to yet a further embodiment, the method can include the processes of FIGS. 1, 2, 3C, 4A, 4B and 5B. According to even a further embodiment, the method can include the processes of FIGS. 1, 2, 3C, 5A and 5B.

Irrespective of any of the above described embodiments, the glass substrate 200 is firmly bonded to the semiconductor wafer 300. The first side 201 of the glass substrate 200 forms here a bonding surface while the second side 202 carries the trenches 205. The openings 205 extend from the first side 201 to the second side 202.

For permanently bonding the glass substrate 200 to the semiconductor wafer 300, any suitable bonding process can be employed. For example, anodic bonding can be used to bond the glass substrate 200 directly on the semiconductor wafer 300, particularly when the semiconductor material of the semiconductor wafer 300 is exposed in the regions of the separation frame 320.

When the first side 301 of the semiconductor wafer 300 is covered, for example by a thin insulating layer in the regions of the separation lines 320, other bonding processes are more suitable. For example, glass-frit bonding provides reliable bond connections. Glass frit bonding uses a glass solder which has a melting temperature lower than that of the glass substrate 200. The fusible glass solder is melted and provides an adhesive bond which can withstand temperatures of up to 500° C. A suitable glass solder is lead glass with a sufficiently high content of lead oxide to reduce the viscosity and melting temperature of the glass as well as Pb-free glass solder with bismuth oxides is commercially available. The glass solder can be, for example, deposited as a thin glass layer on either the glass substrate 200 or the semiconductor wafer 300 by for example stencil-printing and pre-glazed. The semiconductor wafer 300 and the glass substrate 200 are then brought into contact at the designed melting temperature of the glass solder (sealing). Pressure is also applied to keep the semiconductor wafer 300 and the glass substrate 200 in intimate contact.

Another option is fusion bonding. Fusion bonding is performed by joining the semiconductor wafer 300 and the glass substrate 200 together. To this end, the first side or surface 301 of the semiconductor wafer 300 and the first side or bonding surface 201 of the glass substrate 200 are made either hydrophobic or hydrophilic and then brought into contact and annealed at high temperatures.

Anodic bonding, glass-frit bonding and fusion bonding produces bond connections which can withstand very high temperatures of more than 500° C. Anodic bonding and fusion bonding usually produces bond connections which can tolerate even higher temperatures.

Adhesive bonding using a glass adhesive can also be applied. For example, silicate adhesives can be used which are commercially available, for example, from Dow Corning as well as epoxy glue based adhesives, for example, from Epotek. Depending on the nature of the glass adhesive, the adhesive bond connection can withstand temperatures of up to 250° C. to 300° C. for a short time in an inert atmosphere. This is sufficient for many of the manufacturing processes to which the semiconductor wafer 300 is subjected for finishing the semiconductor components.

The glass adhesives, and also the glass solder, can also be photo-structurable when structuring is desired. Further options include formation of a diamond-like-carbon layer (DLC) on the semiconductor wafer 300 to facilitate anodic bonding.

In a further process, an adhesive layer is formed on exposed surfaces 202, 205a, 206a, 207a of the glass substrate 200, the openings 205 and the trench 206. The adhesive layer can be, for example, amorphous silicon. Typically, the adhesive layer is formed after forming the trenches 206 and before bonding the glass substrate 200 to the semiconductor wafer 300. It would, however, also be possible, to form the adhesive layer at any other stage. For example, when the trenches 206 are formed at the first side 201 where the recesses 204 and the trench 206 are formed, the adhesive layer can be deposited on the first side 201 before polishing the second side 202 of the glass substrate 200. Furthermore, the adhesive layer can be deposited after the glass substrate 200 is bonded onto the semiconductor wafer 300.

It is, however, beneficial when the side of the glass substrate 200 where the trenches 206 are formed including the walls of the openings 205 and the trenches 206 are covered by the adhesive layer to enhance adhesion of the later formed metal layer and regions.

The resulting structure after bonding the glass substrate 200 to the semiconductor wafer 300 is illustrated in FIG. 5B. Hence, according to an embodiment, a stack is provided which includes the semiconductor wafer 300 and the glass substrate 200 attached to the semiconductor wafer 300, wherein the semiconductor wafer 300 includes a plurality of semiconductor devices 310, and wherein the glass substrate 200 includes a plurality of openings 205 each leaving respective areas of the semiconductor devices 310 uncovered by the glass substrate 200. At least one trench 206 is formed on a side 202 of the glass substrate 200 facing away from the semiconductor wafer 300 and connecting the openings 205. The trench 206 has a depth d3, as illustrated in FIG. 6, less than a thickness d1 of the glass substrate 200.

FIG. 6 illustrates a further embodiment which includes, in addition to the openings 206, further openings 207. In the following, openings 205 are referred to as first openings and openings 207 will be referred to as second openings. The first openings 205 can be provided for forming a source metallization. The second openings 207 can be provided for forming a gate metallization. The first and second openings 205, 207 can differ from each other in size and/or shape since, for example, the source metallization needs to carry a larger current than the gate metallization.

As described above, the adhesive layer can be formed on all exposed walls and surfaces such as the surface 205a of the first opening 205, the surface 207a of the second opening 207, the surface 206a of the trench 206 and the uncovered area of the semiconductor wafer 300.

Figure 7:
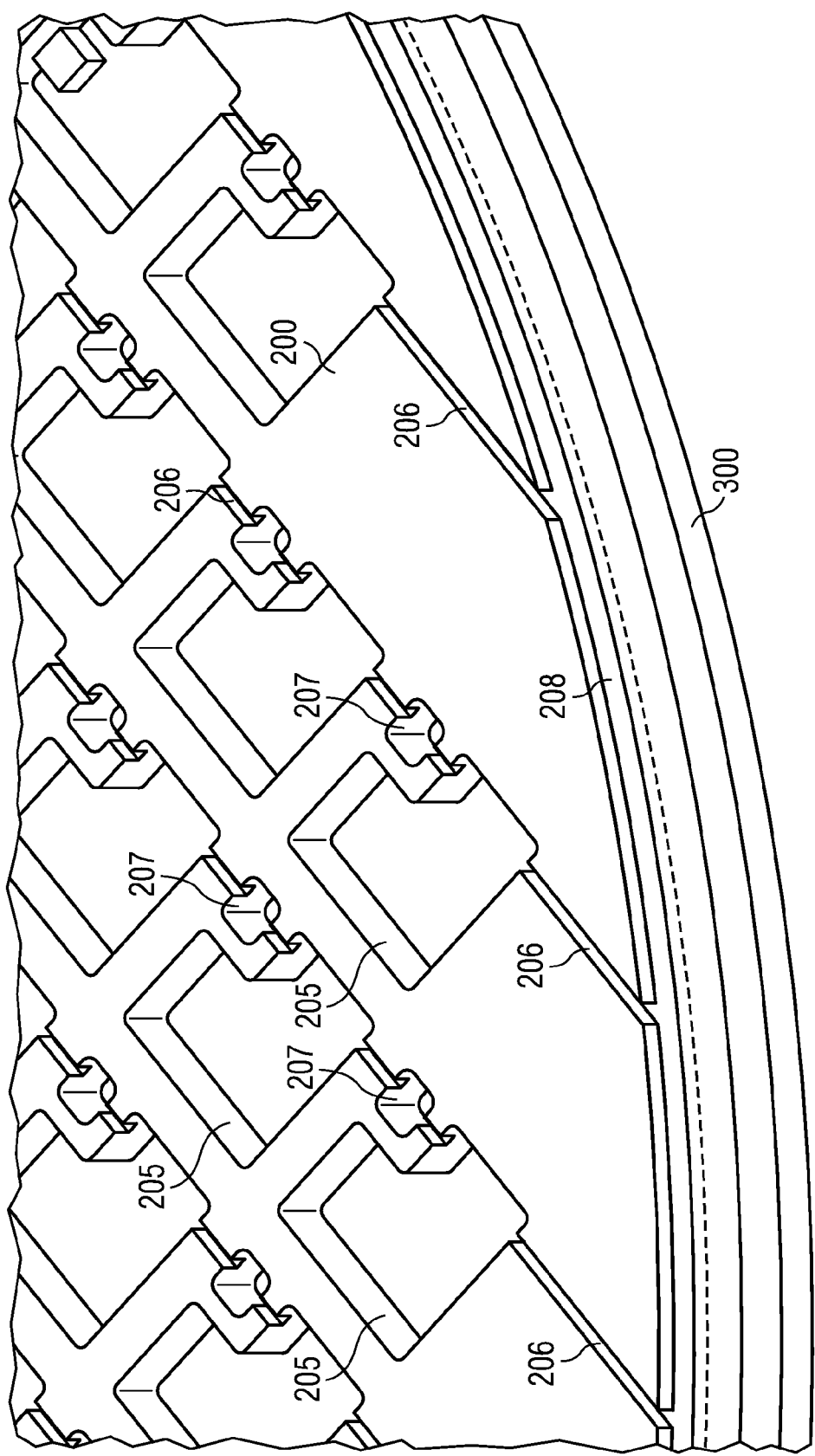
FIG. 7 illustrates a process of a method for manufacturing a semiconductor device according to an embodiment.

The trench 206 connects the first and the second openings 205, 207 of each semiconductor device 310 with the first and second openings 205, 207 of adjacent semiconductor devices 310. This is illustrated best in FIG. 7 showing a 3-dimensional view of a stack which includes the semiconductor wafer 300 and a glass substrate 200 bonded onto the semiconductor wafer 300. A plurality of first and second openings 205, 207 are formed in the glass substrate 200 in an ordered manner corresponding to the location of the respective areas of the semiconductor devices 310 which are to be provided with a metallization. A plurality of trenches 206, which are arranged here in parallel to each other, connect the first and second openings 205, 207 of a respective row of the ordered arrangement. It is also possible to provide more than one trench 206 per opening 205, 207, for example two, by providing additional trenches 206 which can run perpendicular to the trenches 206 shown in FIG. 7 to form a net of trenches 206.

The trenches 206 extend up to the peripheral ring structure 208 which is formed here as a circumferentially running trench having a width larger than the width of the trenches 206. The ring structure 208 provides an electrical contact to each of the trenches 206, when subsequently filled with metal. As each of the first and second openings 205, 207 are connected to at least one of the trenches 206, each of the first and second openings 205, 207 is then also in electrical contact with the ring structure 208.

FIG. 8 illustrates a top view of the glass substrate 200. The bars 222 between adjacent ones of the openings 205 cover and run along and on the separation lines 320 of the separation frame as described above. The trenches 206 cross the bars 222 to connect adjacent ones of the openings 205 of a given row. FIG. 8 illustrates an embodiment where only one opening 205 per semiconductor device 310 is provided in the glass substrate 200.

In a further process, a metal layer 410 is formed at least on exposed walls of the trench 206 and the openings 205 and on the uncovered areas of the semiconductor devices 310 of the semiconductor wafer 300. This is illustrated in FIG. 9 which shows a cross-sectional view along line AA in FIG. 8. When referring to FIG. 6, the metal film 410 is formed on all exposed walls and surfaces such as the surface 205a of the first opening 205, the surface 207a of the second opening 207, the surface 206a of the trench 206, the uncovered area of the semiconductor wafer 300, and also on the second side of the glass substrate 200.

The metal film 410 can be conformally deposited so that the metal film 410 covers all uncovered surfaces of the glass substrate 200 and the areas of the semiconductor wafer left uncovered within the openings 205. Suitable methods for forming the metal film 410 are, for example, sputtering or vaporing.

According to an embodiment, the metal layer 410 is a layer stack including at least two layers, or at least three layers, of different metals or metal alloys. For example, by depositing different metals, a three-layer metal film 410 can be formed. A typical combination is an Al—Ti—Ag stack which provides both a good ohmic connection to the uncovered areas of the semiconductor wafer 300 and a good seed-layer for the subsequent electroplating or in case of a blank glass surface 205 only Ti—Ag stack, due to a good adhesion of Ti to glass surface.

According to an embodiment, the material of the metal film 410 is different than the material of the adhesive layer which was formed, according to an embodiment, at least on the walls of the openings 205 in the glass substrate 200. As described above, the adhesive layer can be an amorphous Si layer.

The metal film 410 is deposited such that it electrically connects the walls and bottoms of the trenches 206 and the ring structures 208 with the walls of the openings 205 and the uncovered areas of the semiconductor wafer 300 exposed in the openings 205. The metal film 410 should also be thick enough to ensure sufficient electrical contact. According to an embodiment, the metal film is about 2 µm, or less than 2 µm thick.

In a further process, as illustrated in FIGS. 10A and 10B, the metal film 410 is removed from the upper surface or side 202 of the glass substrate 200 leaving the metal film 410 on the walls of the trenches 206 and the openings 205, and on the areas of the semiconductor wafer 300 which are left uncovered by the glass substrate 200. The metal film 410 can be, for example, removed by mechanical grinding or polishing such as wet polishing. Removal of the metal film 410 from the second side 202 of the glass substrate 200 prevents that metal is subsequently deposited on the second side 202 of the glass substrate 200 which would then need to be removed later on.

The remaining portions of the metal film 410 on the walls of the trenches 206 and the openings 205 and on the areas of the semiconductor wafer 300 which are left uncovered by the glass substrate 200 are referred to as metal layer 410 which provides the desired electrical connection.

FIG. 10A illustrates a cross-sectional view along line AA of FIG. 8 and FIG. 10B illustrates a cross-sectional view along line BB of FIG. 8.

Figure 11A:
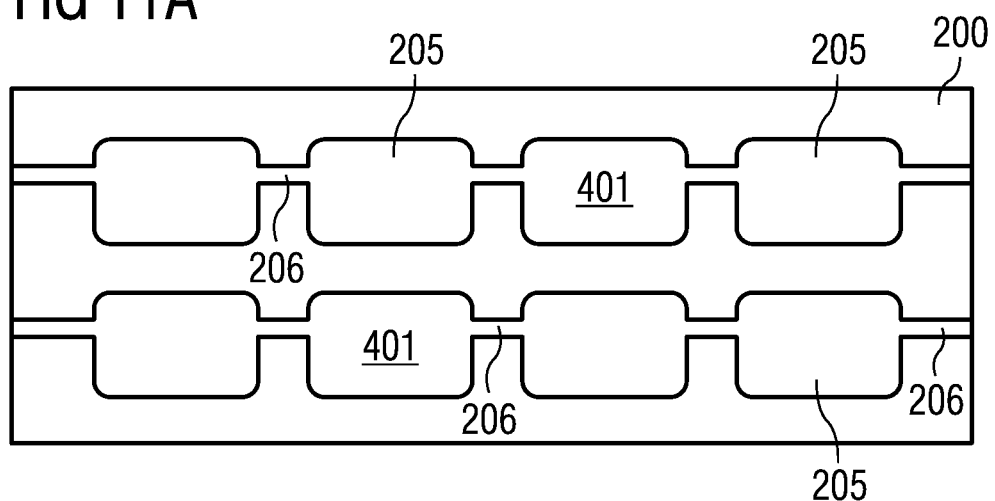
FIGS. 11A and 11B illustrate processes of a method for manufacturing a semiconductor device according to an embodiment.
Figure 11B:
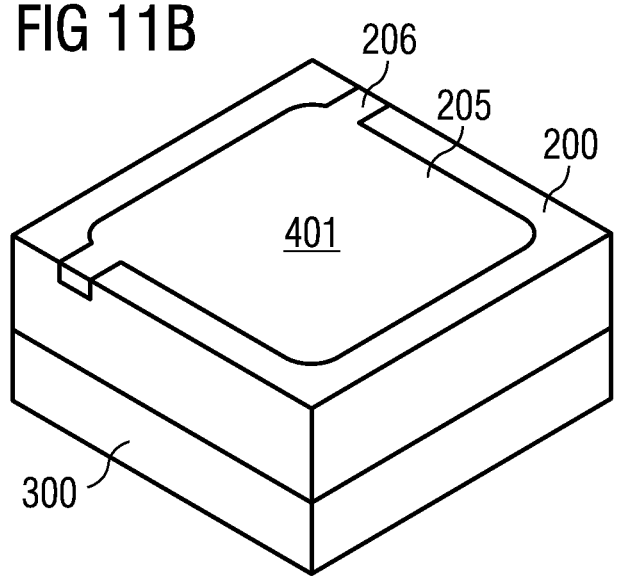

In a further process, as illustrated in FIGS. 11A and 11B, a metal 401 is deposited by electroplating on regions covered by the metal layer 410. For example, Cu and/or Ni can be plated. The trenches 206 and the ring structure 208 provide the electrical contact to these regions during electroplating. Typically, the metal 401 is plated such that it at least partially fills the openings 205. The thickness of the plated metal 401 can be between about 10 µm and 150 µm. Examples range from thicknesses less than 10 µm to thicknesses of up to 50 µm, or 100 µm, or even up to 150 µm. The thickness of the plated metal 401 can depend on the later function of the metal as a heat sink and electrical contact.

The thickness of the glass substrate 200 is typically larger than the final thickness of the metal 401 since the glass substrate 200 is used as a mask to structure the metal 401 upon plating. The mask function of the glass substrate 200 is provided by structuring the glass substrate 200 to form the openings 205 and by forming the metal layer 410 on the walls of the openings 205 of the glass substrate 200 while leaving the upper side or surface 202 of the glass substrate 200 uncovered since this prevents plating of the metal 401 on the upper surface 202 of the glass substrate 200.

FIG. 11B is a 3-dimenionsal illustration of the structure after plating the metal 401 which fills both the openings 205 and the trenches 206, while FIG. 11A is a top view of the glass substrate 200. The plated metal 401 can also overgrow the openings 205 and the trenches 206. Typically, overgrowing of the trenches 206 is more likely since the trenches 206 are shallow in comparison to the openings 205.

Figure 12A:
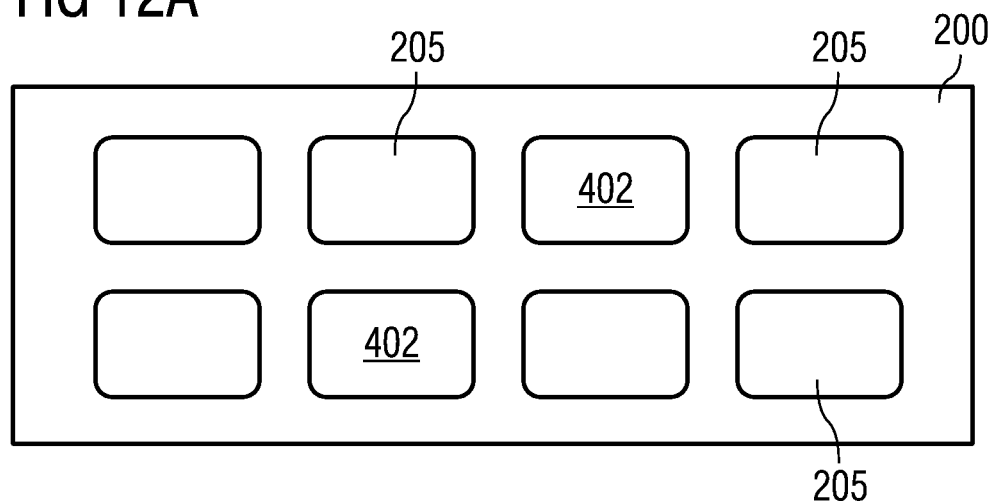
FIGS. 12A and 12B illustrate processes of a method for manufacturing a semiconductor device according to an embodiment.
Figure 12B:
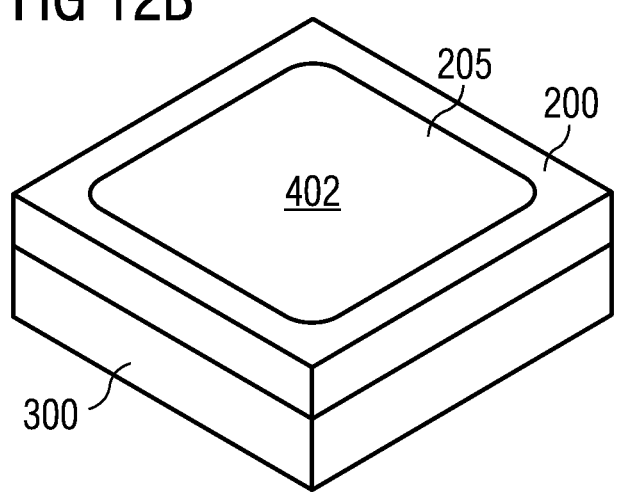

In a further process, as illustrated in FIGS. 12A and 12B, an upper portion of the glass substrate 200 is removed to a depth so that the trenches are removed and no electrical connection between adjacent openings remain. When referring to FIG. 6, the glass substrate 200, and also the plated metal 401, is polished to a level below the bottom part of the trenches 206, i.e. to a depth larger than d3. The thickness d2 of the glass substrate 200 below the trenches 206 is therefore set at least equal to, and typically larger than the desired final thickness of the plated metal 401 after back-grinding or back-polishing. As a result of the grinding or polishing process, the upper surface of the plated metal 401 is flush with the upper surface of the glass substrate 200. The thus processed plated metal 401 is referred to as metal region 402.

According to an embodiment, the final thickness of the metal regions 402 can be between about 50 µm and about 350 µm.

The glass substrate 200 laterally electrically insulates the metal regions 402 from each other and also spaces them which is useful for subsequent separation of the semiconductor devices 310.

Typically, the glass substrate 200 and the plated metal 401 are polished or ground in a common process. As these materials have different properties, typically a rather coarse grinding tool can be used. To effectively remove the abraded glass and metal, the grinding tool can include channels which allow transport of the abraded material. For example, a diamond grinding disc having hollow channels can be used.

The resulting structure is illustrated in FIG. 12B which is a 3-dimenionsal illustration of the back-polished plated metal 401 to form the metal regions 402, while FIG. 12A is a top view of the back-polished glass substrate 200.

Figure 13A:
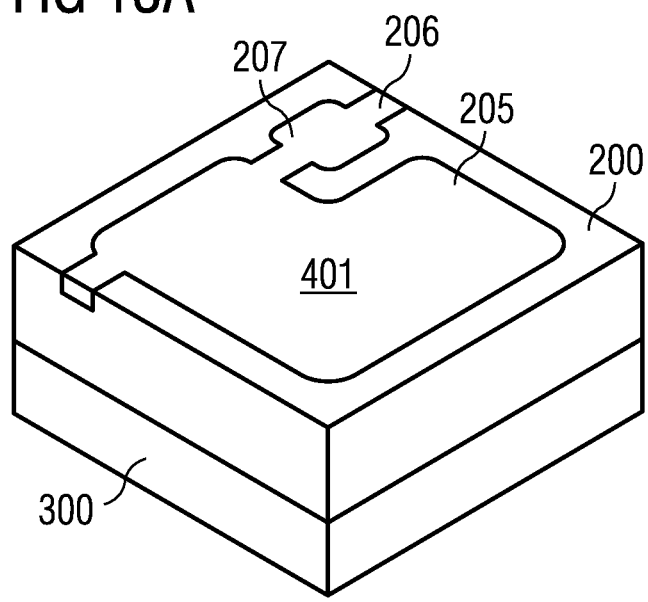
FIGS. 13A and 13B illustrate processes of a method for manufacturing a semiconductor device according to an embodiment.
Figure 13B:
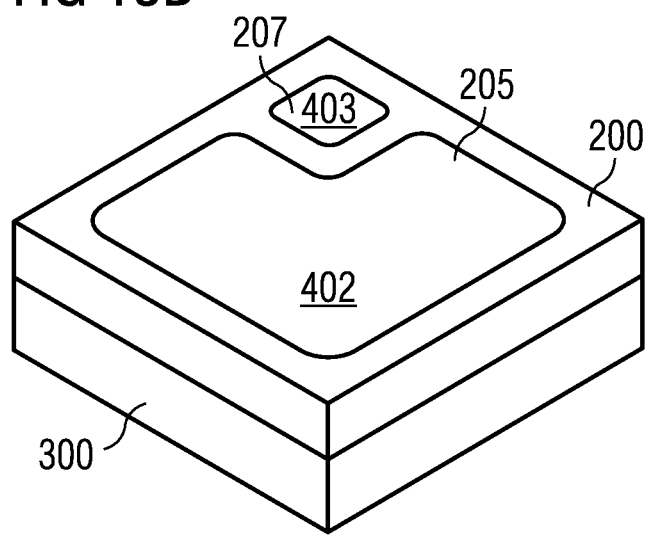

FIGS. 13A and 13B shows processes corresponding to the processes of FIGS. 11B and 12B for an embodiment including the first opening 205 and the second opening 207. While in FIG. 13A the plated metal 401 in the first and second openings 205, 207 is still electrically connected with each other through the trenches 206 filled with the plated metal 401, separate metal regions 402 and 403 remain after back-polishing as shown in FIG. 13B.

Hence, according to an embodiment, at least a metal region 402, 403 is formed by electroplating a metal 401 in the openings 205, 207 and the trench 206 and by subsequently grinding or polishing the glass substrate 200, and also the plated metal 401, to remove the trenches 206 including the metal 401 plated into the trenches 206.

According to an embodiment, the metal layer 410 used as electrical connection and seed-layer is made of a material different than the material of the metal regions 402, 403.

In a further process according to an embodiment, the stack including the semiconductor wafer 300 and the attached glass substrate 200 is cut to separate the semiconductor devices 310. Typically, the cut runs along the separation lines 320 and, since the bars 222 of the glass substrate 200 are arranged on and along the separation lines 320, also along the bars 222.

When separating the semiconductor devices 310 along the separation lines 320, the separation occurs through ceramic material having similar mechanical properties. FIG. 8 illustrates that the separation lines 320 runs through and along the longitudinal extension of the bars 222 of the glass substrates 200 and also through the semiconductor wafer 300. The separation lines 320 do not run through the openings 205, 207 and hence not through the metal regions 402, 403. The glass substrates 200 and the semiconductor wafer 300 have similar mechanical properties as both materials are brittle. Different thereto, the metal regions 402, 403 are of a ductile metal having mechanical properties different to that of the semiconductor wafer 300 and the glass substrates 200. This difference in mechanical properties would cause difficulties during dicing, i.e. separation, when the separation would run through semiconductor wafer 300 and the metal regions 402, 403. These difficulties can be reduced or avoided by the approach as described herein.

According to one or more embodiments, the space between the separate metallization regions 402, 403 is used for dicing. Hence the separation lines 320 run along the spaces but not through the metallization regions 402, 403. This allows an even further increase of the thickness of the metallization regions 402, 403 to improve thermal dissipation. The structuring of the plated metal on the semiconductor wafer 300 by the structured glass substrate 200 also reduces warping of the semiconductor wafer 300.

The bars 222 of the glass substrate 200 should be wide enough to provide sufficient space for the cutting tool and to allow that sufficient glass material is left adjacent each metal region 402, 403 after separation. The cut glass can then provide a lateral electrical insulation and also a mechanical stabilisation of the semiconductor material. For cutting, a saw can be used, for example.

For example, FIG. 13B illustrates a final structure after dicing. The glass substrate 200 still completely laterally surrounds the metal region 402, 403 and also provides lateral electrical insulation between the metal regions 402 and 403.

Furthermore, the glass substrate 200 can serve as a device passivation. This allows omitting the commonly used polyimide-passivation. The glass passivation improves the electrical insulation due to the better dielectric characteristics of glass over polyimide.

Hence, there is described a method for manufacturing semiconductor devices which includes providing a glass substrate 200 having a first side 201, a second side 202, and a plurality of openings 205, 207, wherein the glass substrate 200 has an initial thickness d1. Trenches 206 are formed in the glass substrate 200 at the second side 202 of the glass substrate 200, which connects the openings 205, 207 and which have a depth d3 which is less than the initial thickness d1 of the glass substrate 200. The glass substrate 200 is attached or permanently bonded at its first side 201 on a first side 301 of a semiconductor wafer 300 which includes a plurality of semiconductor devices 310 so that the openings 205, 207 of the glass substrate 200 leave respective areas of the semiconductor devices 310 uncovered at the first side of the semiconductor wafer 300. A metal layer is formed 410 at least on exposed walls of the trenches 206 and the openings 205, 207 and on the uncovered areas of the semiconductor devices of the semiconductor wafer 300. A metal region 402 is formed by electroplating metal 401 in the openings 205, 207 and the trenches 206 and by subsequently grinding the glass substrate 200 to remove the trenches 206. The stack which includes the semiconductor wafer 300 and the attached glass substrate 200 is cut to separate the semiconductor devices 310.

Hence, according to an embodiment, a semiconductor device 310 includes a semiconductor substrate 300 and a glass substrate 200 attached to the semiconductor substrate 300. The glass substrate 200 includes at least one opening 205 leaving a respective area of the semiconductor device 310 uncovered by the glass substrate 200. A metal layer 410 is formed on walls of the opening 205 in the glass substrate 300 and on the uncovered areas of the semiconductor device. A metal region 402 is formed on the metal layer 410 and fills the opening 205, wherein an upper surface of the metal region 402 flushes with an upper surface 202 of the glass substrate 200.

The above described embodiments allow formation of comparably thick metal regions 402, 403 even on the upper surface of the semiconductor devices 310 without the need of a subsequent structuring of the metal regions 402, 403. The metal regions 402, 403 can be, for example at least 10 μm thick and up to 150 μm thick. Furthermore, a lateral electrical insulation even for high-voltage power devices can be reliably provided by the glass substrate 200 which remains between the metal regions 402, 403. Furthermore, more than one metal region for each semiconductor device 310 can be formed on the upper surface, for example for a gate metallization and a source metallization.

In addition to that, electroplating allow formation of metal regions at a higher deposition rate than usual deposition processes. Moreover, deposition can be controlled by providing only those regions with a seed layer where metal regions shall be formed. Hence, the deposition of metal by electroplating allows pattern plating. Furthermore, a subsequent structuring of the metal regions is not needed.

A method for manufacturing semiconductor devices includes providing a stack having a semiconductor wafer 300 and a glass substrate 200 with openings 205 and at least one trench 206 attached to the semiconductor wafer 300. The semiconductor wafer 300 includes a plurality of semiconductor devices 310. The openings 205 of the glass substrate 200 leave respective areas of the semiconductor devices 310 uncovered by the glass substrate 200 while the trench 206 connects the openings 205. A metal layer 410 is formed at least on exposed walls of the trench 206 and the openings 205, 207 and on the uncovered areas of the semiconductor devices of the semiconductor wafer 300. A metal region 402 is formed by electroplating metal 401 in the openings 205, 207 and the trench 206 and by subsequently grinding the glass substrate 200 to remove the trenches 206. The stack of the semiconductor wafer 300 and the attached glass substrate 200 is cut to separate the semiconductor devices 310.

Figure 14A:
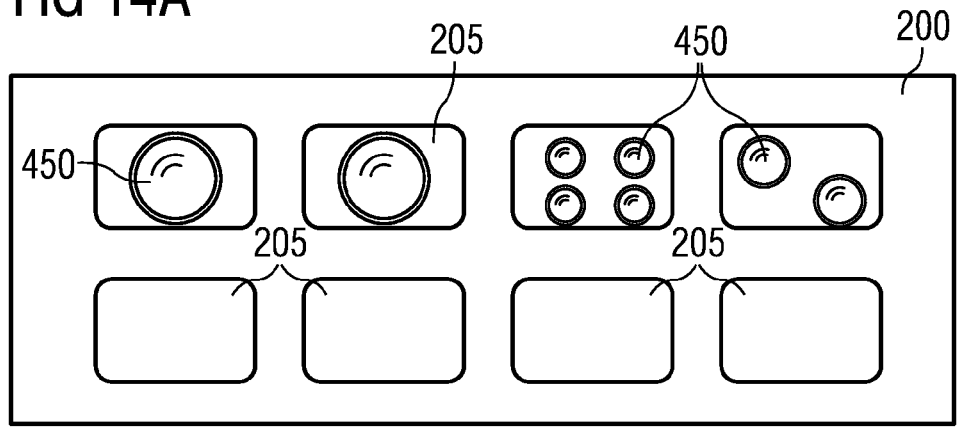
FIGS. 14A to 14C illustrate processes of a method for manufacturing a semiconductor device according to an embodiment.
Figure 14B:
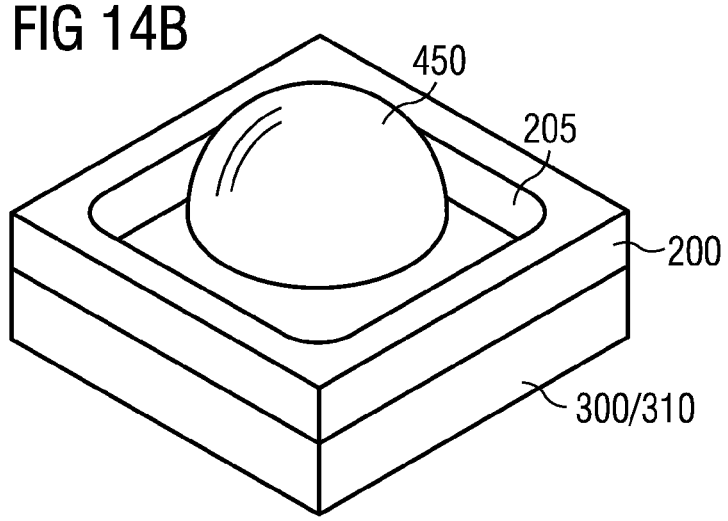

With reference to FIGS. 14A to 14B, a method for manufacturing a semiconductor module is described. This method can include any of the processes of FIGS. 1, 2, 3A to 3C, 5B and 6. The process of forming the trenches 206 can be omitted. Furthermore, no metal layer 410 is formed and no metal 401 is plated.

Hence, a stack is provided which includes a semiconductor wafer 300 and a glass substrate 200 attached to the semiconductor wafer 300. The semiconductor wafer 300 includes a plurality of semiconductor devices 310, and the glass substrate 200 includes a plurality of openings 205 each leaving a respective area of the semiconductor devices 310 uncovered by the glass substrate 200.

In a further process, solder bumps 450 are formed in the openings 205 of the glass substrate 200 on the uncovered areas of the semiconductor device 310. The number of the solder bumps 450 is not restricted to two but can be two, three, four or even more. It is further possible to provide some of the openings 205 with a solder bump 450 while not providing others as illustrated in FIG. 14A.

Figure 14C:
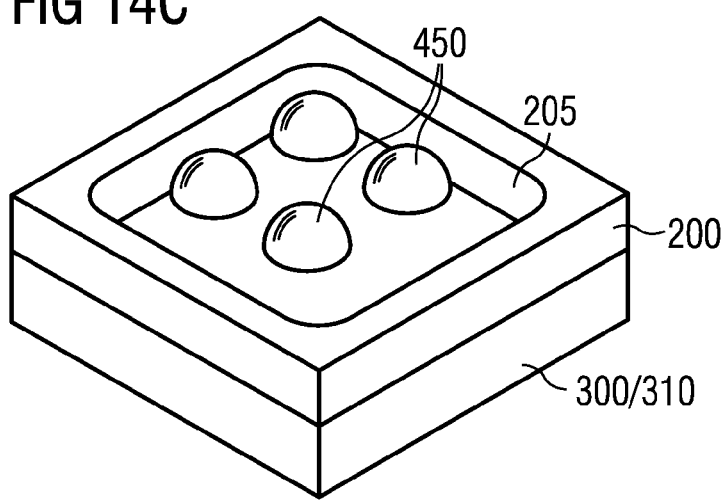

In a further process, the stack is cut to form separate semiconductor devices 310, which are shown, for example, in FIGS. 14B and 14C.

The cutting process can also be carried out before providing the solder bumps 450. Hence, the method can include providing a semiconductor device 310 including a semiconductor substrate 300 and a glass substrate 200 attached to the semiconductor substrate 300. The glass substrate 200 includes at least one opening 205, 207 leaving a respective area of the semiconductor device 310 uncovered by the glass substrate 200. The semiconductor devices 310 can be subsequently separated or after the following process. In a further process at least one solder bump 450 is formed and arranged in the opening 205 of the glass substrate 200 on the uncovered area of the semiconductor device 310.

Therefore, the semiconductor device 310 includes a semiconductor substrate 300 and a glass substrate 200 attached to the semiconductor substrate 300. The glass substrate 200 includes at least one opening 205 leaving a respective area of the semiconductor device 310 uncovered by the glass substrate 200. At least one solder bump 450 is arranged in the opening 205 of the glass substrate 200 on the uncovered area of the semiconductor device 310.

Figure 15:
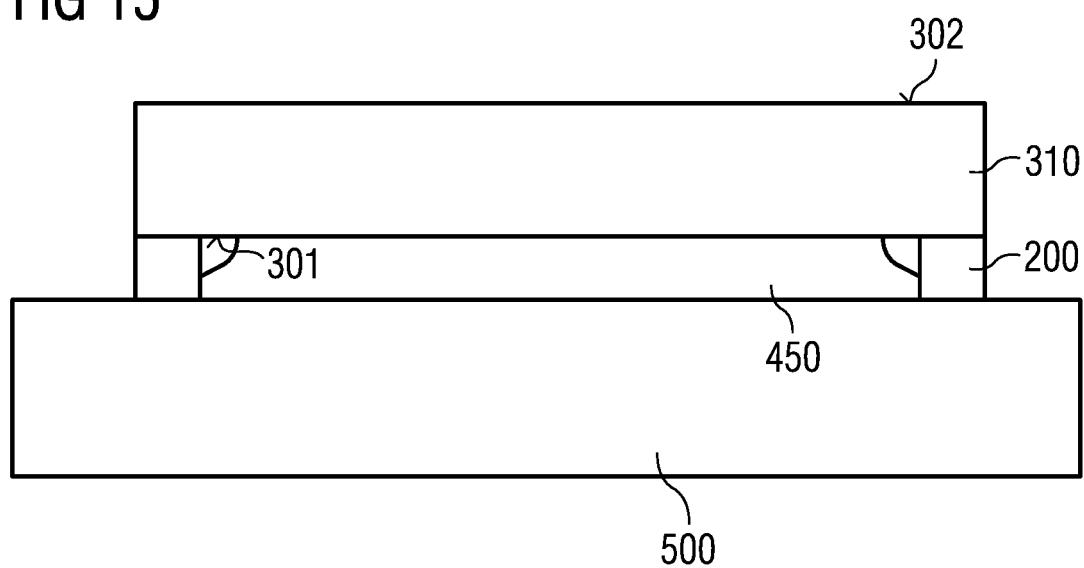
FIG. 15 illustrate a process of a method for manufacturing a semiconductor device according to an embodiment.

In a further process, as illustrated in FIG. 15, the semiconductor device 310 is soldered with the solder bump 450 on a lead frame 500 with the glass substrate 200 arranged between the lead frame 500 and the semiconductor substrate 300.

The above processes are particularly suitable for flip-chip bonding of the semiconductor device 310 as the glass substrate 200 forming a hollow frame blocks the lateral flow of the molten solder and prevents that the molten solder material of the solder bump can bleach-out during soldering. Furthermore, even when molten solder may flow underneath the glass substrate or frame 200 to a lateral rim of the semiconductor device, the glass substrate 200 forms a poor-wettable spacer which spaces the semiconductor material from the solder, as the molten solder does not wet the glass surface.

The geometry, size and location of the openings 205, as well as the number of solder bumps can be varied according to specific needs.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing semiconductor devices, the method comprising:
providing a stack comprising a semiconductor wafer and a glass substrate attached to the semiconductor wafer, the semiconductor wafer comprising a plurality of semiconductor devices, the glass substrate comprising a plurality of openings each leaving a respective area of the semiconductor devices uncovered by the glass substrate, and at least one trench formed on a side of the glass substrate facing away from the semiconductor wafer and connecting the openings, wherein the trench has a depth less than a thickness of the glass substrate;

forming a metal layer at least on exposed walls of the trench and the openings and on the uncovered areas of the semiconductor devices of the semiconductor wafer;

forming a metal region by electroplating metal in the openings and the trench and by subsequently grinding the glass substrate to remove the trenches; and cutting the stack comprising the semiconductor wafer and the attached glass substrate to separate the semiconductor devices.

2. The method of claim 1, wherein providing the stack further comprises:

providing the glass substrate; and bonding the glass substrate to the semiconductor wafer.

3. The method of claim 2, wherein providing the glass substrate comprises:

forming the openings extending through the glass substrate; and forming the trench before bonding the glass substrate to the semiconductor wafer.

4. The method of claim 3, further comprising:

forming a mask on the glass substrate, the mask defining the size and location of the openings; and etching the openings using the mask as an etching mask.

5. The method of claim 3, further comprising:

forming a mask on a first side of the glass substrate, the mask defining the size and location of the openings;

etching recesses in the glass substrate using the mask as an etching mask;

attaching the glass substrate at its first side to a carrier substrate so that the carrier substrate covers the recesses; and polishing a second side of the glass substrate to expose the recesses, wherein the exposed recesses form the openings of the glass substrate.

6. The method of claim 3, further comprising:

forming a first mask on a first side of the glass substrate, the first mask defining the size and location of the openings;

forming a second mask on a second side of the glass substrate, the second mask defining the size and location of the openings; and etching the glass substrate using the first and second masks as etching masks to form the openings.

7. The method of claim 3, further comprising:

forming the trenches by sawing.

8. The method of claim 1, wherein forming the metal layer comprises:

depositing a metal film; and grinding or polishing the metal film to remove the metal film from an upper side of the glass substrate facing away from the semiconductor wafer.

9. The method of claim 1, further comprising:

grinding the metal together with the glass substrate to form the metal region.

10. The method of claim 1, further comprising:

forming an adhesive layer on surfaces of the glass substrate, the openings and the trench.

11. The method of claim 1, wherein the glass substrate further comprises bars between adjacent openings, and wherein the bars cover a separation frame of the semiconductor wafer.

12. The method of claim 1, wherein the glass substrate further comprises bars between adjacent openings, and wherein cutting of the stack comprises cutting the glass substrate along the bars.

13. A method for manufacturing semiconductor devices, the method comprising:

providing a glass substrate comprising a first side, a second side, and a plurality of openings, the glass substrate having an initial thickness;

forming trenches in the glass substrate at the second side of the glass substrate, the trenches connecting the openings and having a depth which is less than the initial thickness of the glass substrate;

attaching the glass substrate at its first side to a first side of a semiconductor wafer comprising a plurality of semiconductor devices so that the openings of the glass substrate leave respective areas of the semiconductor devices uncovered at the first side of the semiconductor wafer;

forming a metal layer at least on exposed walls of the trenches and the openings and on the uncovered areas of the semiconductor devices of the semiconductor wafer;

forming a metal region by electroplating metal in the openings and the trenches and by subsequently grinding the glass substrate to remove the trenches; and cutting the stack comprising the semiconductor wafer and the attached glass substrate to separate the semiconductor devices.

14. The method of claim 13, further comprising:

releasably bonding the glass substrate to a carrier wafer; and forming the trenches by sawing.

15. The method of claim 13, further comprising:

forming a mask on the first side of the glass substrate, the mask defining the size and location of the openings;

etching recesses in the glass substrate using the mask as an etching mask;

releasably bonding the glass substrate at its first side to a carrier wafer, the carrier wafer covering the recesses; and polishing a second side of the glass substrate to expose the recesses, wherein the exposed recesses form the openings of the glass substrate.

16. A method for manufacturing a semiconductor module, the method comprising:

providing a semiconductor device comprising a semiconductor substrate and a glass substrate attached to the semiconductor substrate, the glass substrate comprising at least one opening leaving a respective area of the semiconductor device uncovered by the glass substrate;

forming at least one solder bump in the opening of the glass substrate on the uncovered area of the semiconductor device; and soldering the semiconductor device with the solder bump on a lead frame with the glass substrate arranged between the lead frame and the semiconductor substrate.

17. A method for manufacturing semiconductor modules, the method comprising:

providing a stack comprising a semiconductor wafer and a glass substrate attached to the semiconductor wafer, the semiconductor wafer comprising a plurality of semiconductor devices, the glass substrate comprising a plurality of openings each leaving a respective area of the semiconductor devices uncovered by the glass substrate;

forming solder bumps within the openings of the glass substrate on the uncovered areas of the semiconductor device; and cutting the stack to form separate semiconductor devices.

18. A semiconductor device, comprising:

a semiconductor substrate and a glass substrate attached to the semiconductor substrate, the glass substrate comprising at least one opening leaving a respective area of the semiconductor device uncovered by the glass substrate;

a metal layer on walls of the opening in the glass substrate and on the uncovered areas of the semiconductor device; and a metal region on the metal layer filling the opening, wherein an upper surface of the metal region is flush with an upper surface of the glass substrate.

19. The semiconductor device of claim 18, wherein the metal layer is made of a material different than the metal region.

20. The semiconductor device of claim 19, wherein metal layer is a layer stack comprising at least two layers of different metals or metal alloys.

21. The semiconductor device of claim 18, further comprising an adhesive layer at least on the walls of the opening in the glass substrate of a material different than the material of the metal layer.

22. A semiconductor device, comprising:

a semiconductor substrate and a glass substrate attached to the semiconductor substrate, the glass substrate comprising at least one opening leaving a respective area of the semiconductor device uncovered by the glass substrate; and at least one solder bump arranged within the opening of the glass substrate on the uncovered area of the semiconductor device.

23. The semiconductor device of claim 22, further comprising at least two solder bumps in the opening of the glass substrate on the uncovered area of the semiconductor device.

* * * * *